US008481371B2

(12) United States Patent
Kim et al.

(10) Patent No.: US 8,481,371 B2
(45) **Date of Patent: *Jul. 9, 2013**

(54) THIN PACKAGE SYSTEM WITH EXTERNAL TERMINALS AND METHOD OF MANUFACTURE THEREOF

(75) Inventors: Youngcheol Kim, Young In-si (KR); Myung Kil Lee, Seoul (KR); Gwang Kim, Ichon-si (KR); Koo Hong Lee, Seoul (KR)

(73) Assignee: STATS Chippac Ltd., Singapore (SG)

( * ) Notice: Subject to any disclaimer, the term of this patent is extended or adjusted under 35 U.S.C. 154(b) by 48 days.

This patent is subject to a terminal disclaimer.

(21) Appl. No.: 13/112,717

(22) Filed: May 20, 2011

(65) Prior Publication Data

US 2011/0215456 A1 Sep. 8, 2011

Related U.S. Application Data

(63) Continuation of application No. 11/163,558, filed on Oct. 22, 2005, now Pat. No. 7,947,535.

(51) Int. Cl.
*H01L 21/56* (2006.01)

(52) U.S. Cl.
USPC .......... 438/124; 257/678

(58) Field of Classification Search
USPC .......... 438/123–125; 257/666, 678, 676, 257/690, E23.023
See application file for complete search history.

(56) References Cited

U.S. PATENT DOCUMENTS

| | | | | |
|---|---|---|---|---|
| 5,639,695 | A | 6/1997 | Jones et al. | |
| 5,834,836 | A | 11/1998 | Park et al. | |
| 6,001,671 | A | 12/1999 | Fjelstad | |
| 6,105,245 | A | 8/2000 | Furukawa | |
| 6,261,864 | B1 | 7/2001 | Jung et al. | |
| 6,498,392 | B2 * | 12/2002 | Azuma | 257/676 |
| 6,504,238 | B2 | 1/2003 | Cheng et al. | |
| 6,564,449 | B1 * | 5/2003 | Tsai et al. | 29/830 |
| 6,583,444 | B2 | 6/2003 | Fjelstad | |
| 6,774,467 | B2 | 8/2004 | Horiuchi et al. | |
| 6,867,485 | B2 | 3/2005 | Wallace | |
| 6,956,294 | B2 | 10/2005 | Ball | |
| 7,031,170 | B2 | 4/2006 | Daeche et al. | |
| 7,087,986 | B1 | 8/2006 | Bayan et al. | |
| 7,095,054 | B2 | 8/2006 | Fjelstad | |
| 7,165,316 | B2 * | 1/2007 | Fjelstad | 29/620 |
| 7,193,311 | B2 | 3/2007 | Ogawa et al. | |
| 7,274,089 | B2 | 9/2007 | Punzalan et al. | |
| 7,327,017 | B2 | 2/2008 | Sirinorakul et al. | |
| 7,378,722 | B2 | 5/2008 | Kawai et al. | |
| 2002/0001869 | A1 * | 1/2002 | Fjelstad | 438/48 |
| 2002/0041019 | A1 | 4/2002 | Gang | |
| 2002/0063315 | A1 | 5/2002 | Huang et al. | |
| 2003/0102538 | A1 | 6/2003 | Paulus | |
| 2005/0006730 | A1 | 1/2005 | Owens et al. | |

(Continued)

*Primary Examiner* — Nathan Ha
(74) *Attorney, Agent, or Firm* — Ishimaru & Associates LLP

(57) ABSTRACT

A method of manufacture of a thin package system with external terminals includes: providing a leadframe; providing a template for defining an external bond finger; forming external bond fingers in the template on the leadframe; forming land pad terminals by a first multi-layer plating; providing a die; attaching the die to the land pad terminals above the leadframe with an adhesive on the leadframe; covering an encapsulant over at least portions of the die and the external bond fingers; and removing the leadframe leaving a surface of the adhesive coplanar with a surface of the encapsulant.

20 Claims, 10 Drawing Sheets

1000

1002

U.S. PATENT DOCUMENTS

2005/0029638 A1* 2/2005 Ahn et al. .................... 257/676
2005/0184396 A1 8/2005 Kimura
2005/0212114 A1 9/2005 Kawano et al.
2005/0218499 A1* 10/2005 Chang et al. ................. 257/690
2006/0121647 A1 6/2006 Lin et al.
2007/0102797 A1 5/2007 Kimura

* cited by examiner 100
102
FIG. 1
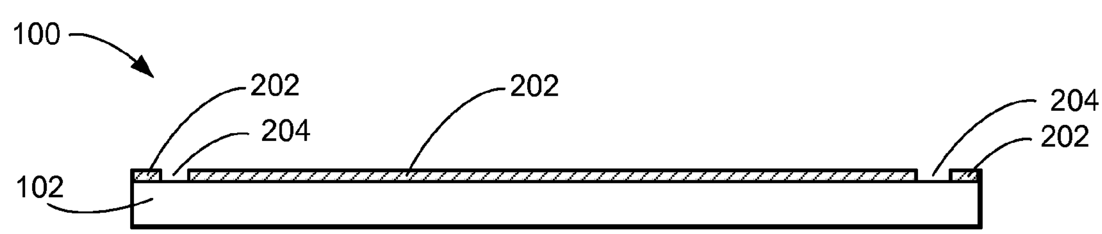
FIG. 2
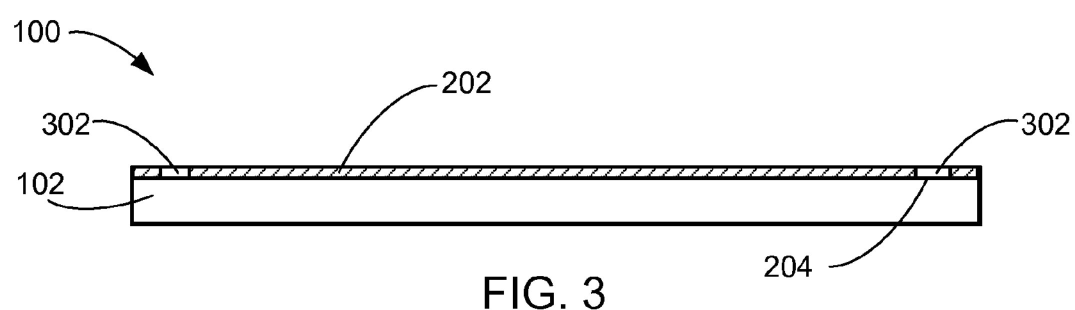
FIG. 3
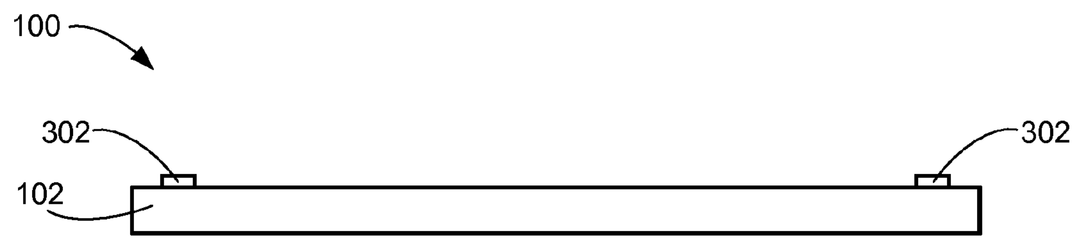
FIG. 4

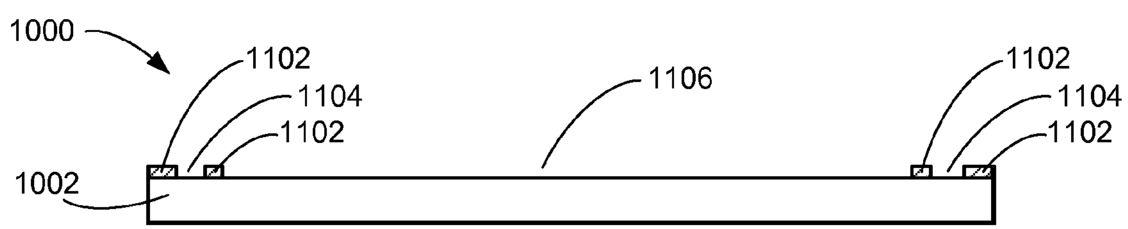
FIG. 10
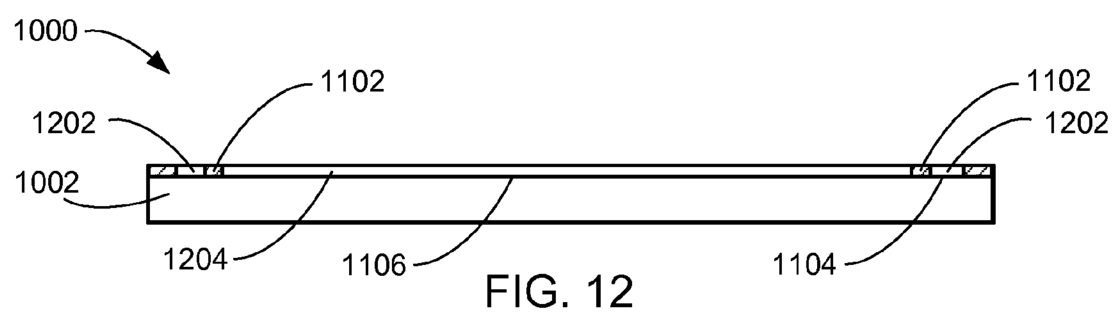
FIG. 11
1000
1202
1102
1002
1204
1106
1102
1202
1104
FIG. 12
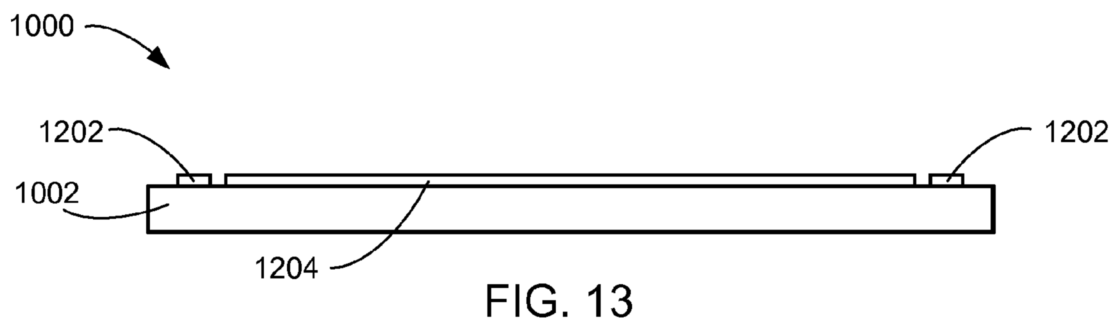
FIG. 13

THIN PACKAGE SYSTEM WITH EXTERNAL TERMINALS AND METHOD OF MANUFACTURE THEREOF

CROSS-REFERENCE TO RELATED APPLICATION(S)

This is a continuation of U.S. patent application Ser. No. 11/163,558 filed Oct. 22, 2005, now U.S. Pat. No. 7,947,535.

TECHNICAL FIELD

The present invention relates generally to semiconductor technology, and more particularly to an integrated circuit thin package system with external terminals.

BACKGROUND ART

Higher performance, lower cost, increased miniaturization of components, and greater packaging density of integrated circuits ("ICs") are ongoing goals of the computer industry. As new generations of IC products are released, the number of devices used to fabricate them tends to decrease due to advances in technology. Simultaneously, the functionality of these products increases. For example, on average there is approximately a 10 percent decrease in components for every product generation over the previous generation with equivalent functionality.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellphones, hands-free cellphone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a leadframe whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a leadframe), a wire-bonding process (electrically connecting the semiconductor die on the paddle to inner leads using leadframe wires), a molding process (encapsulating a predetermined portion of the assembly, containing the die, inner leads and leadframe wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the ball-grid array ("BGA"). BGA packages typically comprise a substrate, such as a printed circuit board ("PCB"), with a semiconductor die having a multitude of bond pads mounted to the top side of the substrate. Wire bonds electrically connect the bond pads to a series of metal traces on the top side of the PCB. This series of metal traces is connected to a second series of metal traces on the back side of the PCB through a series of vias located around the outer periphery of the PCB. The second series of metal traces each terminates with a contact pad where a conductive solder ball is attached. Typically, the semiconductor die and the wire bonds are encapsulated within a molding compound.

In order to reduce manufacturing costs, the electronics industry is increasing the usage of perimeter BGA packages. In perimeter BGA packages, the conductive solder balls are arranged in an array pattern on the back side of the PCB between the vias and the semiconductor die. The inner-most conductive solder balls typically are beneath or in close proximity to the outer edges of the semiconductor die.

Still thinner, smaller, and lighter package designs and mounting/connecting configurations have been adopted in response to continuing requirements for further miniaturization. At the same time, users are demanding semiconductor packages that are more reliable under increasingly severe operating conditions.

Accordingly, there exists an ever-greater need for semiconductor packages that support the electronics industry's demands, at lower costs yet with higher performance, increased miniaturization, and greater packaging densities, to provide and support systems that are capable of achieving optimal thin, high-density footprint semiconductor systems. In view of the ever-increasing need to save costs, improve efficiencies, and meet competitive pressures, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a thin package system with external terminals including: providing a leadframe; providing a template for defining an external bond finger; forming external bond fingers in the template on the leadframe; forming land pad terminals by a first multi-layer plating; providing a die; attaching the die to the land pad terminals above the leadframe with an adhesive on the leadframe; covering an encapsulant over at least portions of the die and the external bond fingers; and removing the leadframe leaving a surface of the adhesive coplanar with a surface of the encapsulant.

The present invention provides a thin package system with external terminals including: external bond fingers having the characteristics of having been formed on a leadframe by a template; land pad terminals having a first multi-layer plating, adjacent to the external bondfingers; a die on the land pad terminals having the characteristics of having been attached to the leadframe; an adhesive around the land pad terminals and under the die; and an encapsulant over at least portions of the die and the external bond fingers, a surface of adhesive coplanar with a surface of the encapsulant.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a view of a thin landed chip-carrier package in the initial stages of fabrication according to the present invention;

FIG. 2 is the structure of FIG. 1 after deposition thereon of a resist;

FIG. 3 is the structure of FIG. 2 after plating for external bond fingers;

FIG. 4 is the structure of FIG. 3 after removal of the resist;

FIG. 10 is a view of a thin landed chip-carrier package in the initial stages of fabrication according to another embodiment of the present invention;

FIG. 11 is the structure of FIG. 10 after deposition thereon of a resist;

FIG. 12 is the structure of FIG. 11 after plating of external bond fingers and a ground pad;

FIG. 13 is the structure of FIG. 12 after removal of the resist;

BEST MODE FOR CARRYING OUT THE INVENTION

Figure 5:
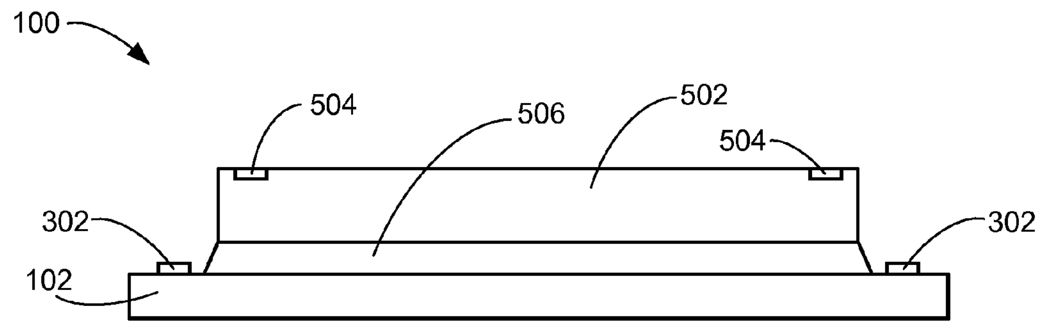
FIG. 5 is the structure of FIG. 4 after attaching a die with terminal pads to the leadframe.

The following embodiments are described in sufficient detail to enable those skilled in the art to make and use the invention. It is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the devices are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the die, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a package 100 in the very initial stages of the fabrication thereof, leading when completed to an extremely fine or thin landed chip-carrier package, "extremely fine or thin" referring to a package with less than 0.5 mm of overall profile (e.g., thickness) and with the pitch of the terminal pads less than 0.5 mm.

In the initial stage of the fabrication shown in FIG. 1, a leadframe 102 of a copper ("Cu") alloy is provided.

Referring now to FIG. 2, therein is shown the structure of FIG. 1 following deposition or application thereon of a resist 202. The resist 202 is a template that has openings 204 therethrough to define external bond fingers 302 (not shown, but see FIG. 3), that will be subsequently formed therein on the leadframe 102.

Referring now to FIG. 3, therein is shown the structure of FIG. 2 following the plating thereon for external bond fingers 302 in the openings 204.

In one embodiment, the external bond fingers 302 having a vertically straight side without a curvature going upwards are formed by a plating process, which may be a four-layer plating. The first or lowermost layer, plated directly onto the leadframe 102, is a 0.003 μm gold ("Au") layer. On top of the 0.003 μm Au layer is a 0.1 μm palladium ("Pd") layer, on top of which is a 5.0 μm nickel ("Ni") layer. Finally, the topmost layer is a 0.5 μm Pd layer plated onto the Ni layer.

Referring now to FIG. 4, therein is shown the structure of FIG. 3 following removal of the resist 202 (FIG. 3).

Referring now to FIG. 5, therein is shown the structure of FIG. 4 following attachment of a die 502. The die 502, having terminal pads 504, has been attached to the leadframe 102 with an insulating adhesive 506.

Figure 6:
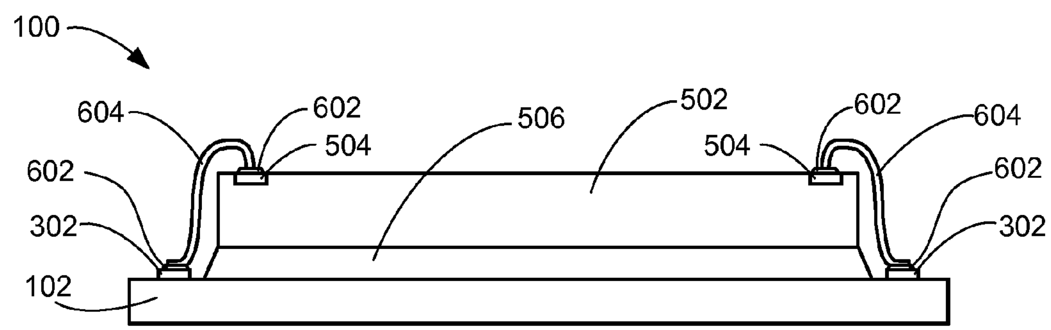
FIG. 6 is the structure of FIG. 5 after wire bonding the terminal pads to the external bond fingers.

Referring now to FIG. 6, therein is shown the structure of FIG. 5 following wire bonding of the terminal pads 504 to the external bond fingers 302 using Au stud bumps 602 to connect leadframe wires 604 to the terminal pads 504 and the external bond fingers 302.

Figure 7:
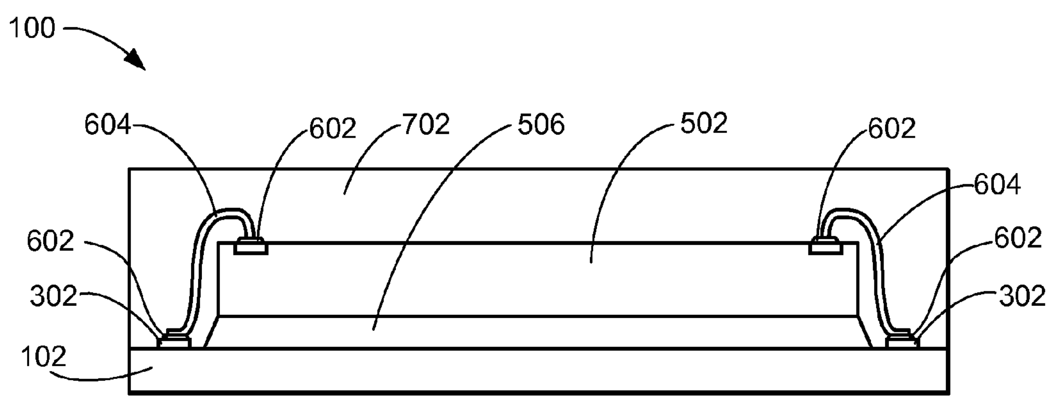
FIG. 7 is the structure of FIG. 6 after encapsulating the portions above the leadframe.

Referring now to FIG. 7, therein is shown the structure of FIG. 6 after encapsulation of the portions thereof above the leadframe 102 in an encapsulant 702.

Figure 8:
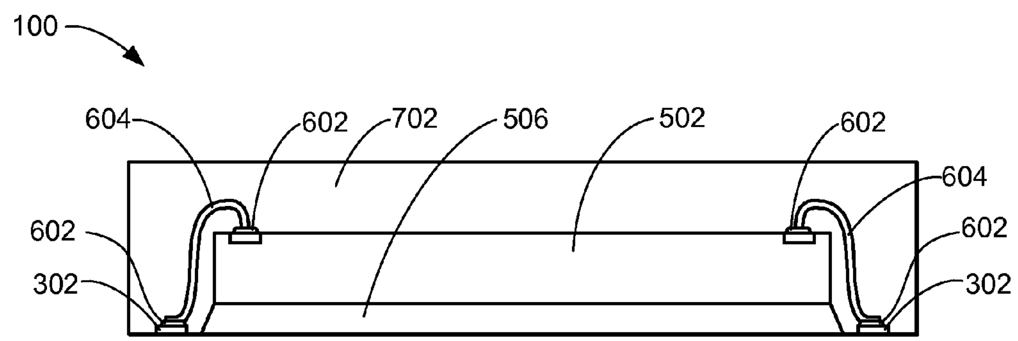
FIG. 8 is a view of the structure of FIG. 7, taken on section line 8-8 in FIG. 9, after dissolving the leadframe.
Figure 9:
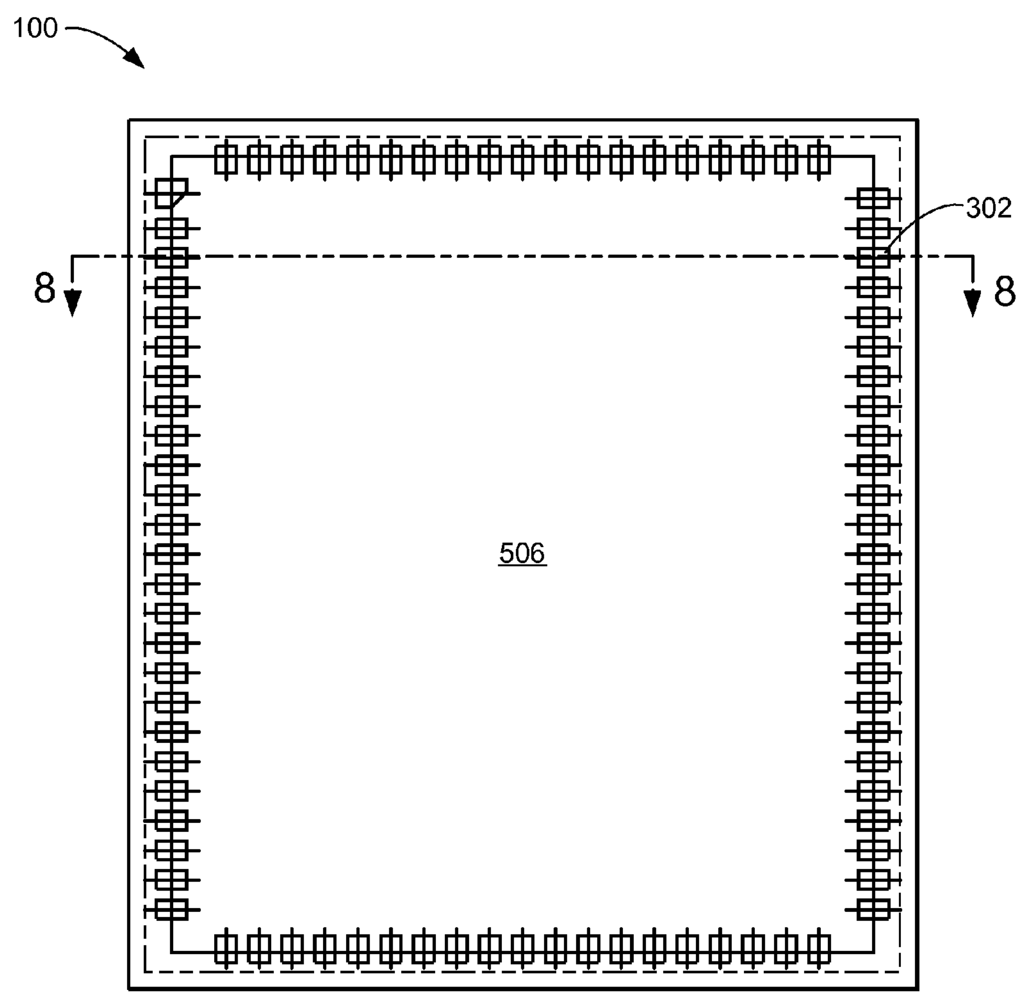
FIG. 9 is a bottom view of the structure of FIG. 8.

Referring now to FIG. 8, therein is shown a view of the structure of FIG. 7 taken on section line 8-8 in FIG. 9 following dissolving of the leadframe 102 (FIG. 7) to remove it and expose the external bond fingers 302, thereby completing the formation of the package 100. In the package 100 the external bond fingers 302 then have the characteristics of having been formed by the process described above, and the die 502 has the characteristics of having been attached to the leadframe 102. (For example, such die characteristics could include the characteristics of having been subjected to the dissolving of the attached leadframe, such as by etching thereof.)

In one embodiment in which the leadframe 102 is a Cu alloy leadframe, the leadframe 102 may be dissolved by an etching solution known as an A-process solution. It is an ammoniacal etchant that uses ammonia to complex copper ions and thereby retain the copper in the etchant solution without affecting plating such as the external bond fingers 302.

Referring now to FIG. 9, therein is shown a bottom view of the structure of FIG. 8.

Referring now to FIG. 10, therein is shown a package 1000 in the very initial stages of the fabrication thereof, leading when completed to an extremely fine or thin landed chip-carrier package. In this initial stage of the fabrication, a leadframe 1002 of a Cu alloy is provided.

Referring now to FIG. 11, therein is shown the structure of FIG. 10 following deposition or application thereon of a resist 1102. The resist 1102 is a template that has openings 1104 therethrough to define external bond fingers 1202 (not shown, but see FIG. 12), that will be subsequently formed therein on the leadframe 1002. Also provided in the resist 1102 is an opening 1106 to define a ground pad 1204 (not shown, but see FIG. 12), that will be subsequently formed therein on the leadframe 1002.

Referring now to FIG. 12, therein is shown the structure of FIG. 11 following the plating thereon of external bond fingers 1202 in the openings 1104, and the plating of the ground pad 1204 in the opening 1106.

In one embodiment, the plating that forms the external bond fingers 1202 and the ground pad 1204 is a four-layer plating. The first or lowermost layer, plated directly onto the leadframe 1002, is a 0.003 μm Au layer. On top of the 0.003 μm Au layer is a 0.1 μm Pd layer, on top of which is a 5.0 μm Ni layer. Finally, the topmost layer is a 0.5 μm Pd layer plated onto the Ni layer.

Referring now to FIG. 13, therein is shown the structure of FIG. 12 following removal of the resist 1102 (FIG. 12).

Figure 14:
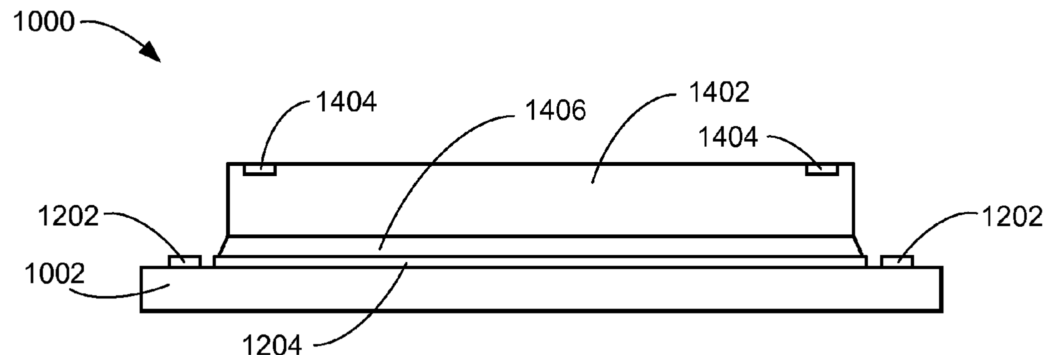
FIG. 14 is the structure of FIG. 13 after attaching a die with terminal pads to the leadframe.

Referring now to FIG. 14, therein is shown the structure of FIG. 13 following attachment of a die 1402. The die 1402, having terminal pads 1404, has been attached to the leadframe 1002 with an insulating adhesive 1406. The die 1402 may be connected electrically through the insulating adhesive 1406 to the ground pad 1204.

Figure 15:
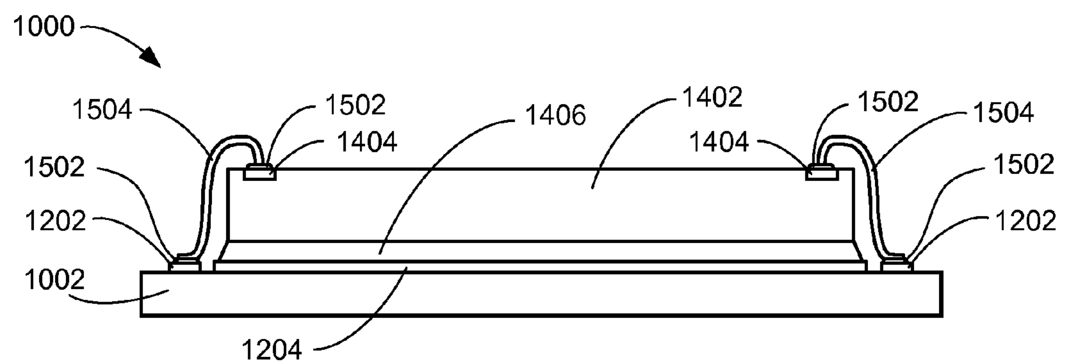
FIG. 15 is the structure of FIG. 14 after wire bonding the terminal pads to the external bond fingers.

Referring now to FIG. 15, therein is shown the structure of FIG. 14 following wire bonding of the terminal pads 1404 to the external bond fingers 1202 using Au stud bumps 1502 to connect leadframe wires 1504 to the terminal pads 1404 and the external bond fingers 1202.

Figure 16:
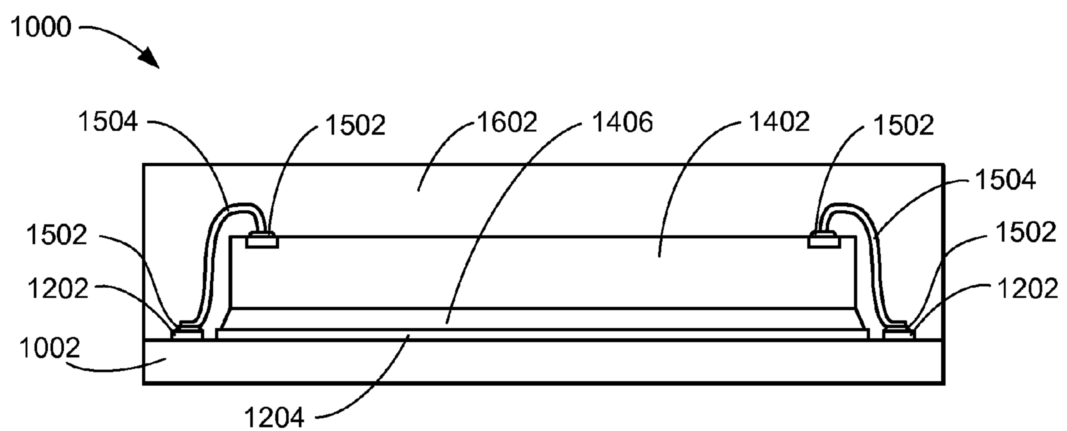
FIG. 16 is the structure of FIG. 15 after encapsulating the portions above the leadframe.

Referring now to FIG. 16, therein is shown the structure of FIG. 15 after encapsulation of the portions thereof above the leadframe 1002 in an encapsulant 1602. The encapsulant 1602 covers portions of the ground pad 1204 and exposes a surface of the ground pad 1204.

Figure 17:
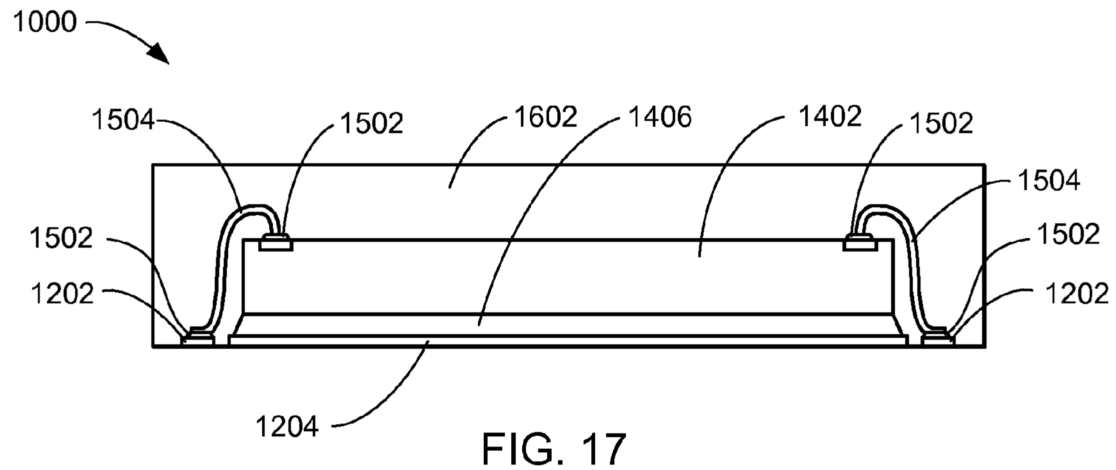
FIG. 17 is a view of the structure of FIG. 16, taken along line 17-17 in FIG. 18, after dissolving the leadframe.
Figure 18:
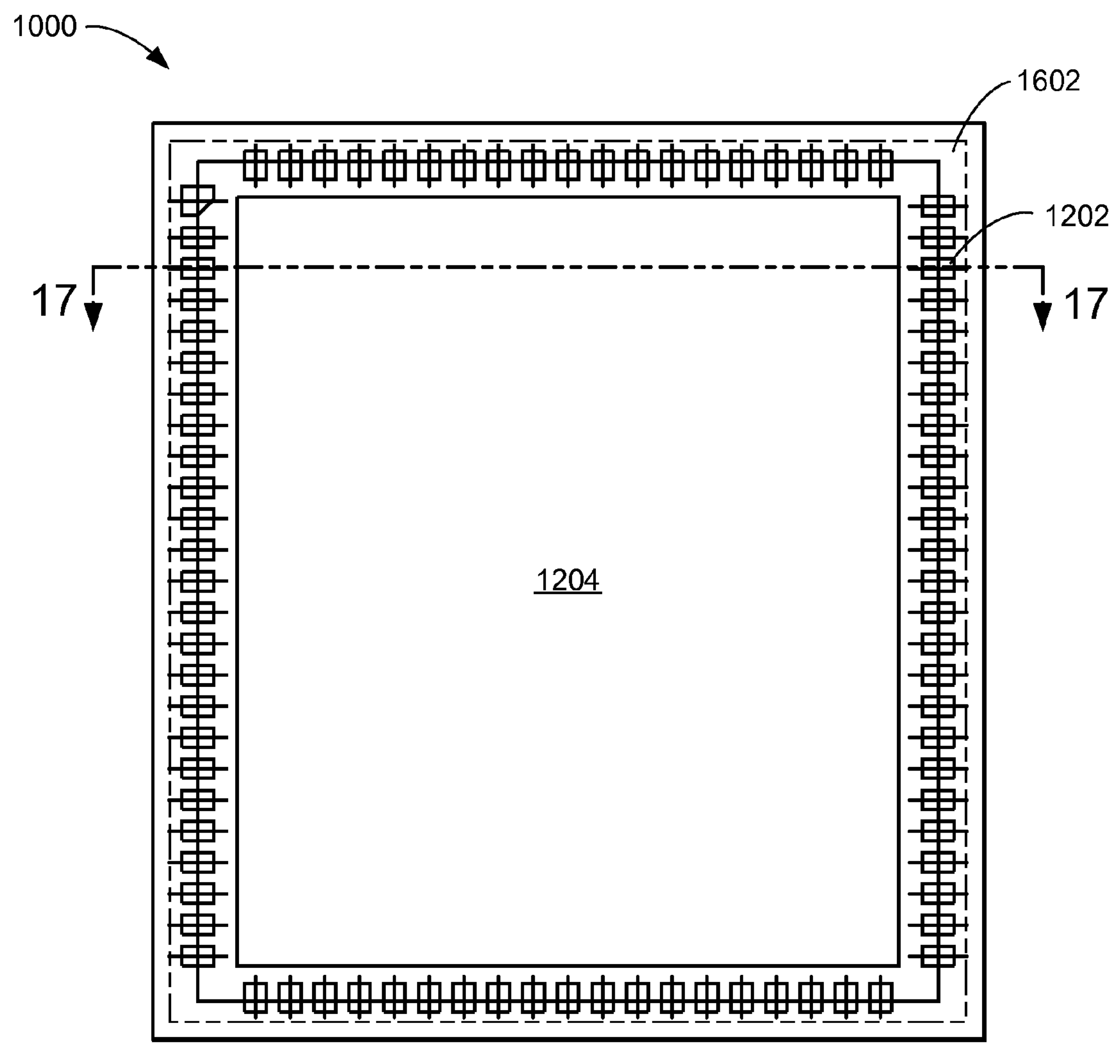
FIG. 18 is a bottom view of the structure of FIG. 17.

Referring now to FIG. 17, therein is shown a view of the structure of FIG. 16 taken on section line 17-17 in FIG. 18 following dissolving of the leadframe 1002 (FIG. 16) to remove it and expose the external bond fingers 1202 and the ground pad 1204, thereby completing the formation of the package 1000. In the package 1000 the external bond fingers 1202 and the ground pad 1204 have the characteristics of having been formed by the process described above, and the die 1402 has the characteristics of having been attached to the leadframe 1002.

Referring now to FIG. 18, therein is shown a bottom view of the structure of FIG. 17.

Figure 19:
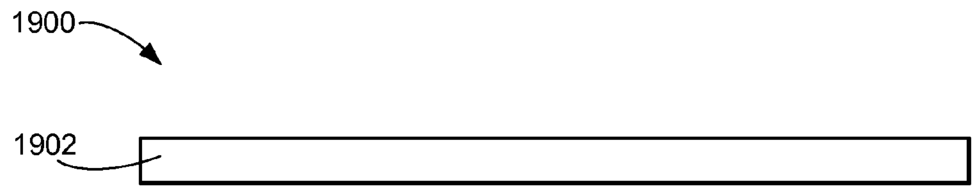
FIG. 19 is a view of a thin landed chip-carrier package in the initial stages of fabrication according to another embodiment of the present invention.

Referring now to FIG. 19, therein is shown a package 1900 in the very initial stages of the fabrication thereof, leading when completed to an extremely fine or thin landed chip-carrier package. In this initial stage of the fabrication, a leadframe 1902 of a Cu alloy is provided.

Figure 20:
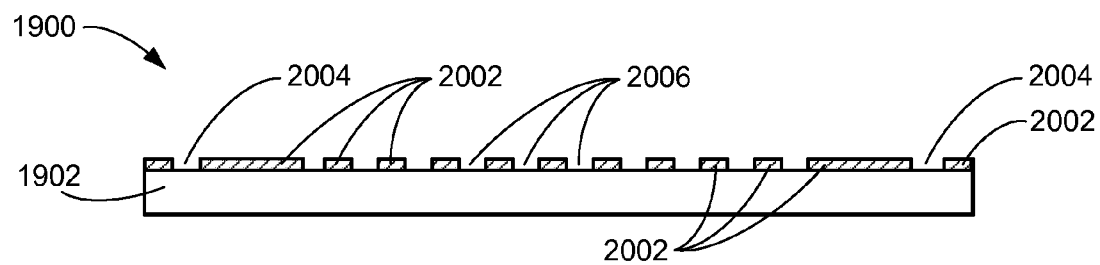
FIG. 20 is the structure of FIG. 19 after deposition thereon of a resist.

Referring now to FIG. 20, therein is shown the structure of FIG. 19 following deposition thereon of a resist 2002. The resist 2002 is a template that has openings 2004 therethrough to define external bond fingers 2102 (not shown, but see FIG. 21), that will be subsequently formed therein on the leadframe 1902. Also provided in the resist 2002 are openings 2006 to define land pad terminals 2104 (not shown, but see FIG. 21), that will be subsequently formed therein on the leadframe 1902.

Figure 21:
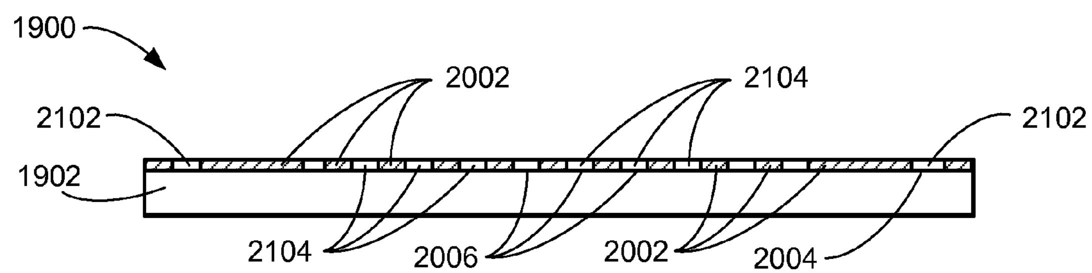
FIG. 21 is the structure of FIG. 20 after plating of external bond fingers and land pad terminals.

Referring now to FIG. 21, therein is shown the structure of FIG. 20 following the plating thereon of external bond fingers 2102 in the openings 2004 and land pad terminals 2104 in the openings 2006.

In one embodiment, the plating that forms the external bond fingers 2102 and the land pad terminals 2104 is a four-layer plating. The first or lowermost layer, plated directly onto the leadframe 1902, is a 0.003 μm Au layer. On top of the 0.003 μm Au layer is a 0.1 μm Pd layer, on top of which is a 5.0 μm Ni layer. Finally, the topmost layer is a 0.5 μm Pd layer plated onto the Ni layer.

Figure 22:
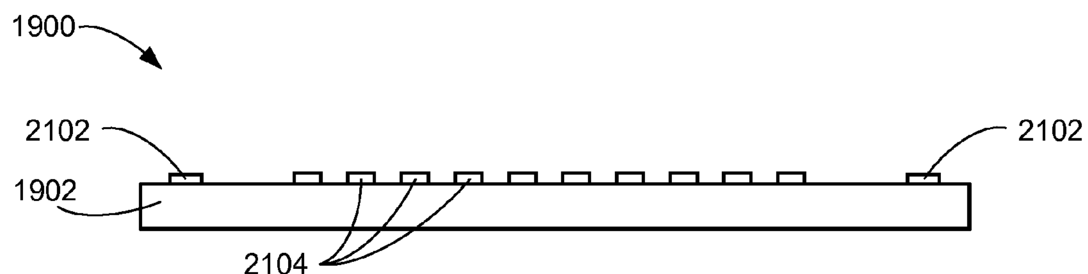
FIG. 22 is the structure of FIG. 21 after removal of the resist.

Referring now to FIG. 22, therein is shown the structure of FIG. 21 following removal of the resist 2002 (FIG. 21).

Figure 23:
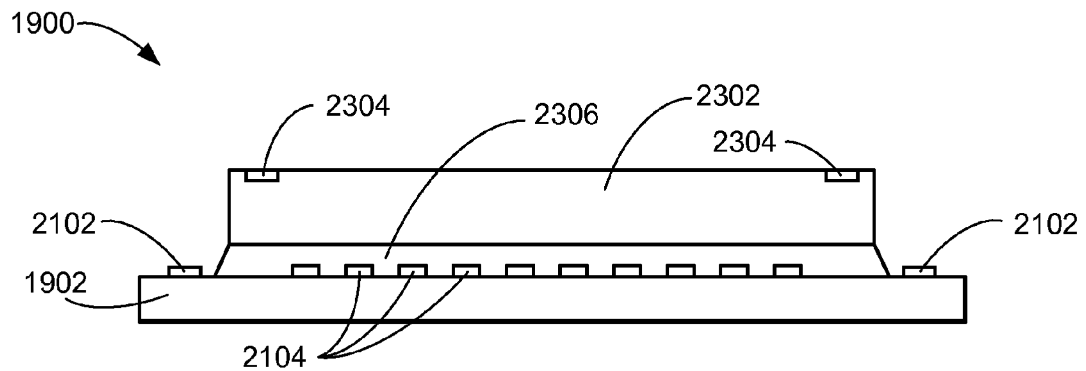
FIG. 23 is the structure of FIG. 22 after attaching a die with terminal pads to the leadframe.

Referring now to FIG. 23, therein is shown the structure of FIG. 22 following attachment of a die 2302. The die 2302, having terminal pads 2304, has been attached to the leadframe 1902 with an insulating adhesive 2306. The die 2302 may be connected electrically through the insulating adhesive 2306 to the land pad terminals 2104.

Figure 24:
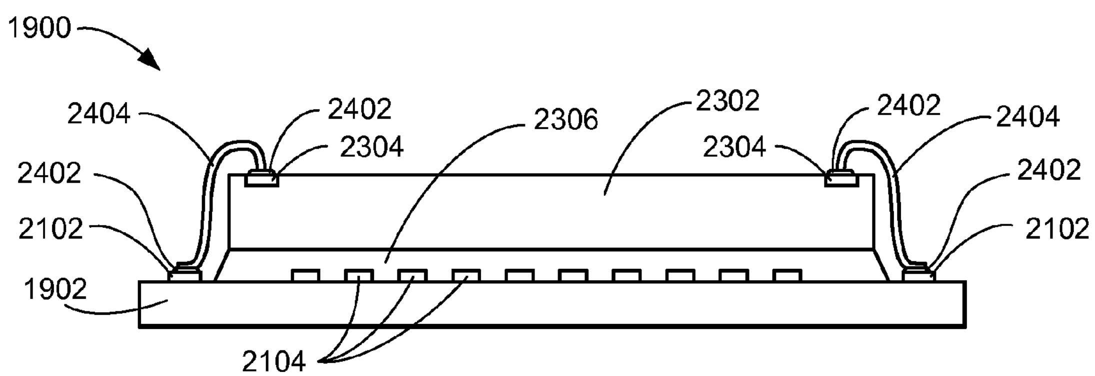
FIG. 24 is the structure of FIG. 23 after wire bonding the terminal pads to the external bond fingers.

Referring now to FIG. 24, therein is shown the structure of FIG. 23 following wire bonding of the terminal pads 2304 to the external bond fingers 2102 using Au stud bumps 2402 to connect leadframe wires 2404 to the terminal pads 2304 and the external bond fingers 2102.

Figure 25:
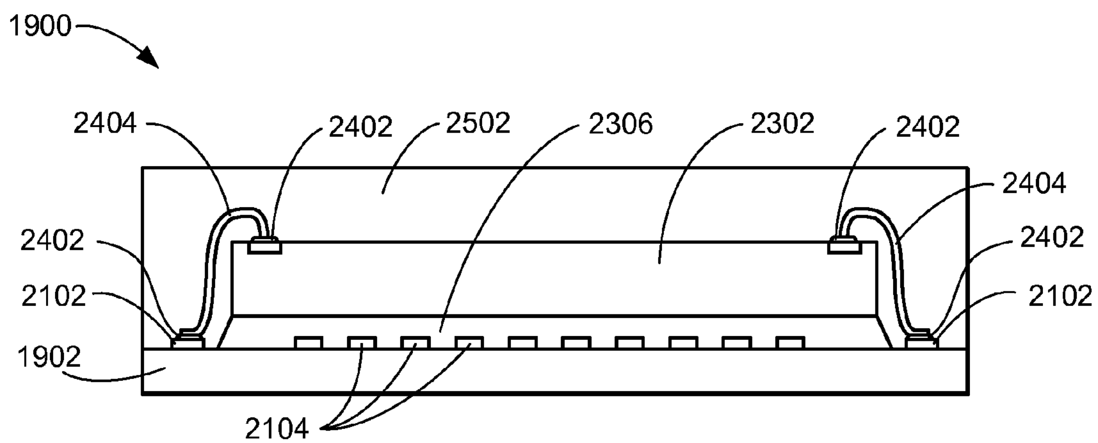
FIG. 25 is the structure of FIG. 24 after encapsulating the portions above the leadframe.

Referring now to FIG. 25, therein is shown the structure of FIG. 24 after encapsulation of the portions thereof above the leadframe 1902 in an encapsulant 2502. The land pad terminals 2104 are shown formed on and above the leadframe 1902. The land pad terminals 2104 have multiple conductive elements. The land pad terminals 2104 are formed adjacent to the external bond fingers 2102. The die 2302 is further shown as mounted above the land pad terminals 2104. The land pad terminals 2104 are further shown as having a vertically straight side without a curvature going upwards.

Figure 26:
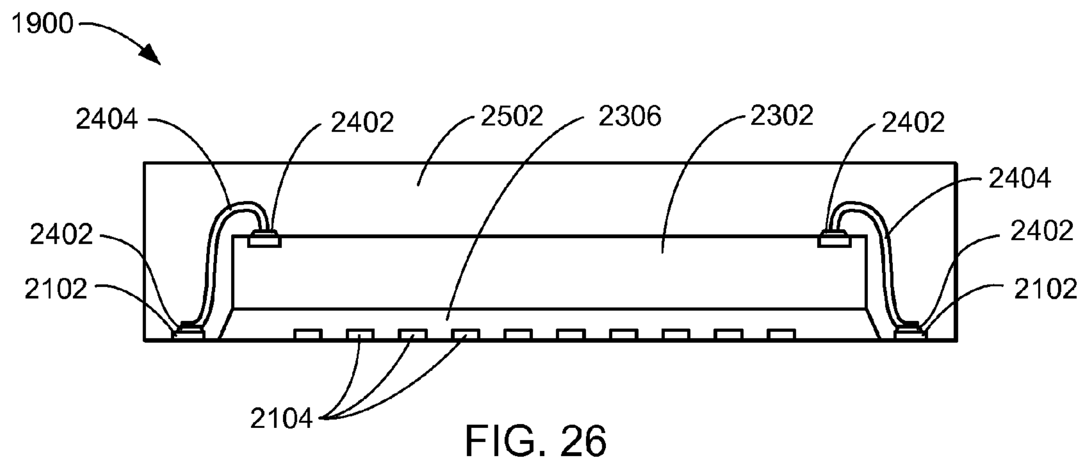
FIG. 26 is a view of the structure of FIG. 25, taken along line 26-26 in FIG. 27, after dissolving the leadframe.
Figure 27:
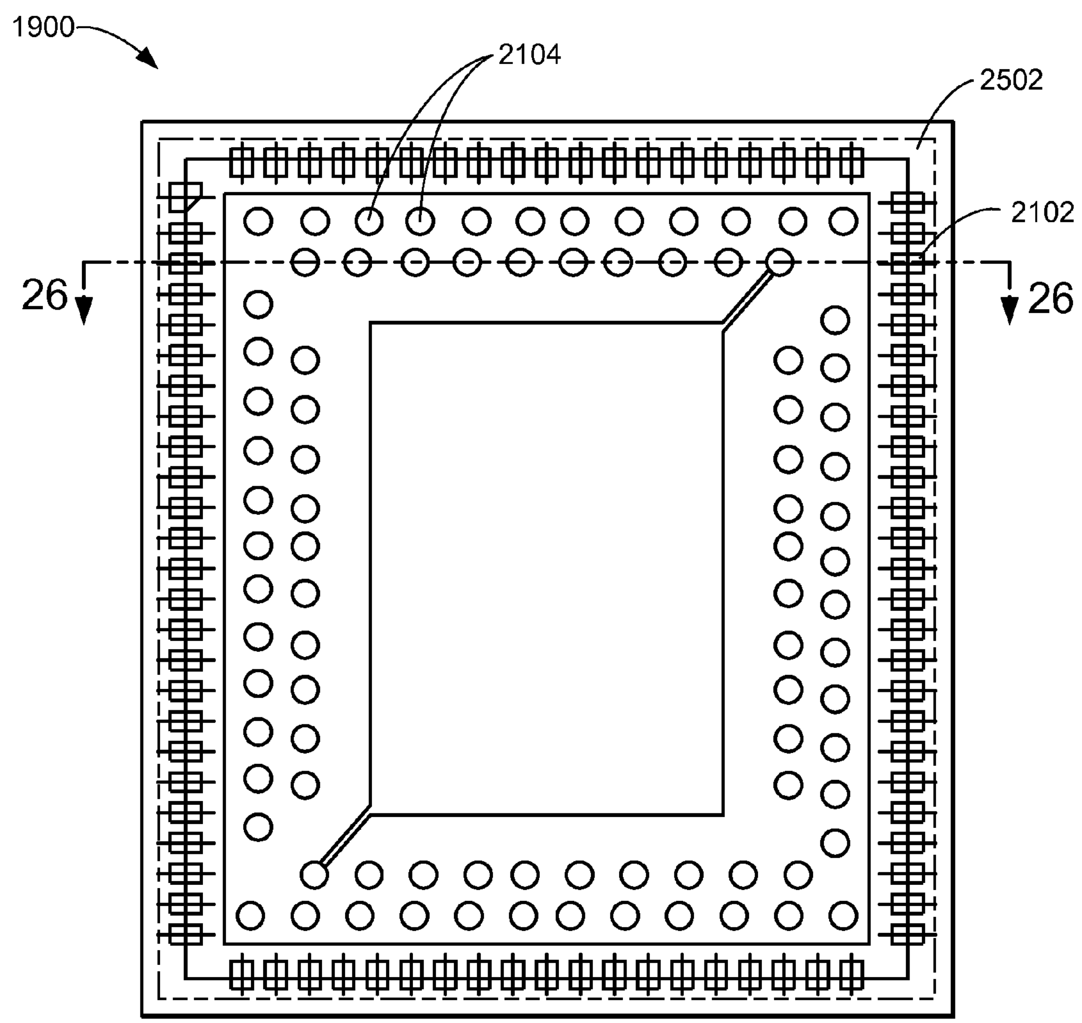
FIG. 27 is a bottom view of the structure of FIG. 26.

Referring now to FIG. 26, therein is shown a view of the structure of FIG. 25 taken on section line 26-26 in FIG. 27 following dissolving of the leadframe 1902 (FIG. 25) to remove it and expose the external bond fingers 2102 and the land pad terminals 2104, thereby completing the formation of the package 1900. In the package 1900 the external bond fingers 2102 and the land pad terminals 2104 have the characteristics of having been formed by the process described above, and the die 2302 has the characteristics of having been attached to the leadframe 1902. Removing the leadframe 1902 leaves a surface of the insulating adhesive 2306 coplanar with a surface of the encapsulant 2502.

Referring now to FIG. 27, therein is shown a bottom view of the structure of FIG. 26.

Figure 28:
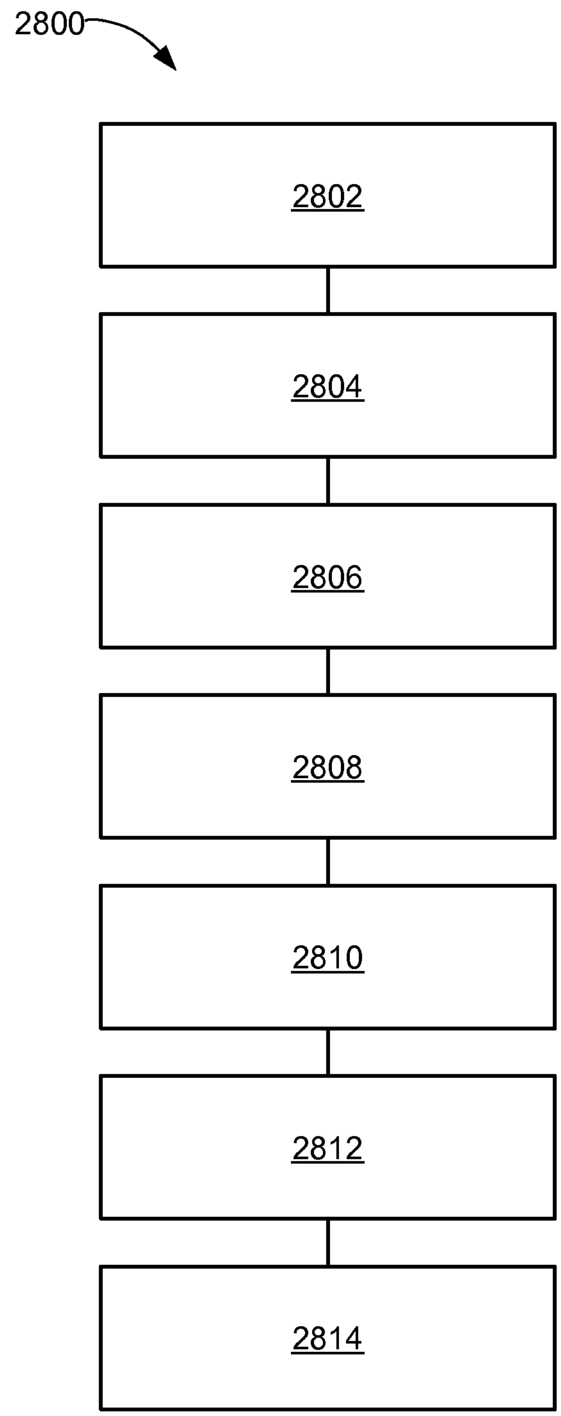
FIG. 28 is a flow chart of a thin package system with external terminals in accordance with an embodiment of the present invention.

Referring now to FIG. 28, therein is shown a flow chart of a thin package system 2800 with external terminals in accordance with an embodiment of the present invention. The thin package system 2800 includes providing a leadframe in a block 2802; providing an external bond finger defining template in a block 2804; using the template to form external bond fingers on the leadframe in a block 2806; providing a die in a block 2808; attaching the die to the leadframe in a block 2810; encapsulating at least portions of the die and the external bond fingers in a block 2812; and removing the leadframe in a block 2814.

It has been discovered that the present invention thus has numerous advantages.

A principle advantage is that the present invention provides an extremely fine, thin landed chip-carrier package.

Another advantage of the present invention is the unexpected discovery that extremely thin packages can be formed by initially plating the package terminals or lands as very thin structures on a base sacrificial leadframe.

Another advantage is that other suitable template configurations, in addition to or instead of photoresist masks, may be used as appropriate or desired.

Yet another advantage of the present invention is that the external bond fingers may be arrayed inwardly on the bottom surface of the package or along the bottom edges of the bottom surface of the package, as needed to interface with a subsequent substrate.

Still another advantage of the present invention is that the external bond fingers can be on any number of the sides of the package, such as from one through all four, and may be arranged in single rows, or several rows, in-line or staggered, and in any desired combination and mix of these configurations.

A significant advantage of the present invention is thus that it is extremely useful and advantageous in advancing the functionality and minimizing the size of package-in-package ("PiP") packages.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the thin package system with external terminals of the present invention furnish important and heretofore unknown and unavailable solutions, capabilities, and functional advantages for thin packages for packaged semiconductor devices. The resulting processes and configurations are straightforward, cost-effective, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacture of a thin package system with external terminals, comprising:

providing a leadframe;

providing a template for defining an external bond finger;

forming external bond fingers in the template on the leadframe;

forming land pad terminals by a first multi-layer plating;

providing a die;

attaching the die to the land pad terminals above the leadframe with an adhesive on the leadframe;

covering an encapsulant over at least portions of the die and the external bond fingers; and removing the leadframe leaving a surface of the adhesive coplanar with a surface of the encapsulant.

2. The method as claimed in claim 1 wherein the leadframe is a copper alloy leadframe.

3. The method as claimed in claim 1 wherein:

providing the template for defining the external bond finger includes providing the template for defining a ground plane; and further comprising:

forming the ground plane on the leadframe with the template.

4. The method as claimed in claim 1 wherein:

providing the template for defining the external bond finger includes providing the template for defining land pad terminals; and attaching the die above the leadframe includes connecting the die electrically to the land pad terminals.

5. The method as claimed in claim 1 wherein using the template to form external bond fingers includes plating a second multi-layer plating having a first layer of about 0.003 μm gold, a second layer of about 0.1 μm palladium, a third layer of about 5.0 μm nickel, and a fourth layer of about 0.5 μm palladium.

6. A method of manufacture of a thin package system with external terminals, comprising:

providing a leadframe;

forming a resist on the leadframe, the resist having openings therethrough;

plating external bond fingers on the leadframe in the openings through the resist;

removing the resist;

forming land pad terminals by a first multi-layer plating;

providing a die having terminal pads;

attaching the die to the land pad terminals above the leadframe with an adhesive;

wire bonding the die to the external bond fingers with gold stud bumps connecting leadframe wires to the terminal pads on the die and gold stud bumps connecting the leadframe wires to the external bond fingers;

covering an encapsulant over at least portions of the die and the external bond fingers; and dissolving the leadframe leaving a surface of the adhesive coplanar with a surface of the encapsulant.

7. The method as claimed in claim 6 wherein the leadframe is a copper alloy leadframe.

8. The method as claimed in claim 6 wherein:

forming the resist includes forming the resist with a ground plane opening therein; and plating the external bond fingers includes forming a ground plane in the ground plane opening in the resist.

9. The method as claimed in claim 6 wherein:

forming the resist includes forming the resist with land pad terminal openings therein;

forming the land pad terminals includes forming land pad terminals in the land pad terminal openings in the resist; and attaching the die above the leadframe further comprises connecting the die electrically to the land pad terminals.

10. The method as claimed in claim 6 wherein plating the external bond fingers onto the leadframe includes plating a second multi-layer plating having a first layer of about 0.003 μm gold, a second layer of about 0.1 μm palladium, a third layer of about 5.0 μm nickel, and a fourth layer of about 0.5 μm palladium.

11. A thin package system with external terminals, comprising:

external bond fingers having the characteristics of having been formed on a leadframe by a template;

land pad terminals formed from a first multi-layer plating, adjacent to the external bondfingers;

a die on the land pad terminals having the characteristics of having been attached to the leadframe;

an adhesive around the land pad terminals and under the die; and an encapsulant over at least portions of the die and the external bond fingers, a surface of adhesive coplanar with a surface of the encapsulant.

12. The system as claimed in claim 11 wherein the characteristics of having been formed on and attached to a leadframe includes the characteristics of having been formed on and attached to a copper alloy leadframe.

13. The system as claimed in claim 11 further comprising a ground plane covered by the encapsulant having the characteristics of having been formed on the leadframe.

14. The system as claimed in claim 11 wherein the land pad terminals are connected electrically to the die and have the characteristics of having been formed on the leadframe, the characteristics including the land pad terminals having a vertically straight side.

15. The system as claimed in claim 11 wherein the external bond fingers include a second multi-layer plating having a first layer of about 0.003 μm gold, a second layer of about 0.1 μm palladium, a third layer of about 5.0 μm nickel, and a fourth layer of about 0.5 μm palladium.

16. The system as claimed in claim 11 further comprising:

leadframe wires and gold stud bumps wire bonding the terminal pads on the die to the external bond fingers; and wherein:

the external bond fingers having the characteristics of having been formed on the leadframe by plating through openings in a resist; and the adhesive exposing a layer of the first multi-layer plating from the adhesive.

17. The system as claimed in claim 16 wherein the external bond fingers have a vertically straight side.

18. The system as claimed in claim 16 wherein the adhesive exposes a layer of the first multi-layer plating from the adhesive.

19. The system as claimed in claim 16 wherein the adhesive exposes only a lower-most layer of the first multi-layer plating from the adhesive.

20. The system as claimed in claim 16 wherein the external bond fingers include a second multi-layer plating having a first layer of about 0.003 μm gold, a second layer of about 0.1 μm palladium, a third layer of about 5.0 μm nickel, and a fourth layer of about 0.5 μm palladium.

* * * * *